(12) United States Patent
Li et al.

(10) Patent No.: US 10,121,564 B2
(45) Date of Patent: Nov. 6, 2018

(54) METHOD FOR MAKING TRANSPARENT CONDUCTIVE LAYER

(71) Applicants: Tsinghua University, Beijing (CN); HON HAI PRECISION INDUSTRY CO., LTD., New Taipei (TW)

(72) Inventors: Dong-Qi Li, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/662,251

(22) Filed: Jul. 27, 2017

(65) Prior Publication Data
US 2018/0122530 A1    May 3, 2018

(30) Foreign Application Priority Data

Oct. 31, 2016 (CN) .......................... 2016 1 0942312

(51) Int. Cl.
| | |
|---|---|
| *H01B 1/04* | (2006.01) |
| *H01L 51/00* | (2006.01) |
| *H01B 5/14* | (2006.01) |
| *H01B 13/00* | (2006.01) |
| *H01J 37/28* | (2006.01) |
| *H01L 21/3205* | (2006.01) |
| *H01L 21/3213* | (2006.01) |

(Continued)

(52) U.S. Cl.
CPC ................. *H01B 1/04* (2013.01); *H01B 5/14* (2013.01); *H01B 13/0036* (2013.01); *H01J 37/28* (2013.01); *H01L 51/0017* (2013.01); *H01L 51/0048* (2013.01); *H01J 2237/2813* (2013.01); *H01L 21/32056* (2013.01); *H01L 21/32136* (2013.01); *H01L 22/12* (2013.01); *H01L 29/456* (2013.01)

(58) Field of Classification Search
None
See application file for complete search history.

(56) References Cited

PUBLICATIONS

J. Li et al., Nano Letters, vol. 12, pp. 4095-4101. (Year: 2012).*

(Continued)

*Primary Examiner* — Jiong-Ping Lu
(74) *Attorney, Agent, or Firm* — ScienBiziP, P.C.

(57) ABSTRACT

A method for making a transparent conductive layer comprising: providing a carbon nanotube film comprising a plurality of carbon nanotubes; providing a conductive substrate and applying an insulating layer on the conductive substrate; laying the carbon nanotube film on a surface of the insulating layer, and placing the carbon nanotube film under a scanning electron microscope; adjusting the scanning electron microscope, and taking photos of the carbon nanotube film with the scanning electron microscope; obtaining a photo of the carbon nanotube film, wherein the photo shows the plurality of carbon nanotubes and a background, a plurality of first carbon nanotubes of the plurality of carbon nanotubes have lighter color than a color of the background, a plurality of second carbon nanotubes of the plurality of carbon nanotubes have deeper color than the color of the background; and removing the plurality of second carbon nanotubes.

14 Claims, 5 Drawing Sheets

(51) Int. Cl.
*H01L 21/66* (2006.01)
*H01L 29/45* (2006.01)

(56) References Cited

PUBLICATIONS

C. Liu and H. Cheng, Journal of the American Chemical Society, vol. 138, pp. 6690-6698. (Year: 2016).*

* cited by examiner

METHOD FOR MAKING TRANSPARENT CONDUCTIVE LAYER

CROSS-REFERENCE TO RELATED APPLICATIONS

This application claims all benefits accruing under 35 U.S.C. § 119 from China Patent Application No. 201610942312.3, filed on Oct. 31, 2016, in the China Intellectual Property Office, the contents of which are hereby incorporated by reference.

FIELD

The present disclosure relates to a method for making transparent conductive layer.

BACKGROUND

Carbon nanotube film as a transparent conductive layer, is used in more and more areas of application. In the prior art, the carbon nanotube film formed by a certain method is directly used as a transparent conductive layer. However, since the carbon nanotubes can be classified into a metallic type and a semiconducting type, the conductivity of the semiconductor type carbon nanotubes is poor. Therefore, when a carbon nanotube film is used as the transparent conductive layer, the semiconducting type of carbon nanotubes in the carbon nanotube film will affect the conductivity of the transparent conductive layer. Therefore, the transparent conductive layer formed by conventional method is not good and need to be further improved.

What is needed, therefore, is to provide a method for making conductive layer that can overcome the above disadvantages.

BRIEF DESCRIPTION OF THE DRAWINGS

Implementations of the present technology will now be described, by way of example only, with reference to the attached figures, wherein.

DETAILED DESCRIPTION

Figure 1:
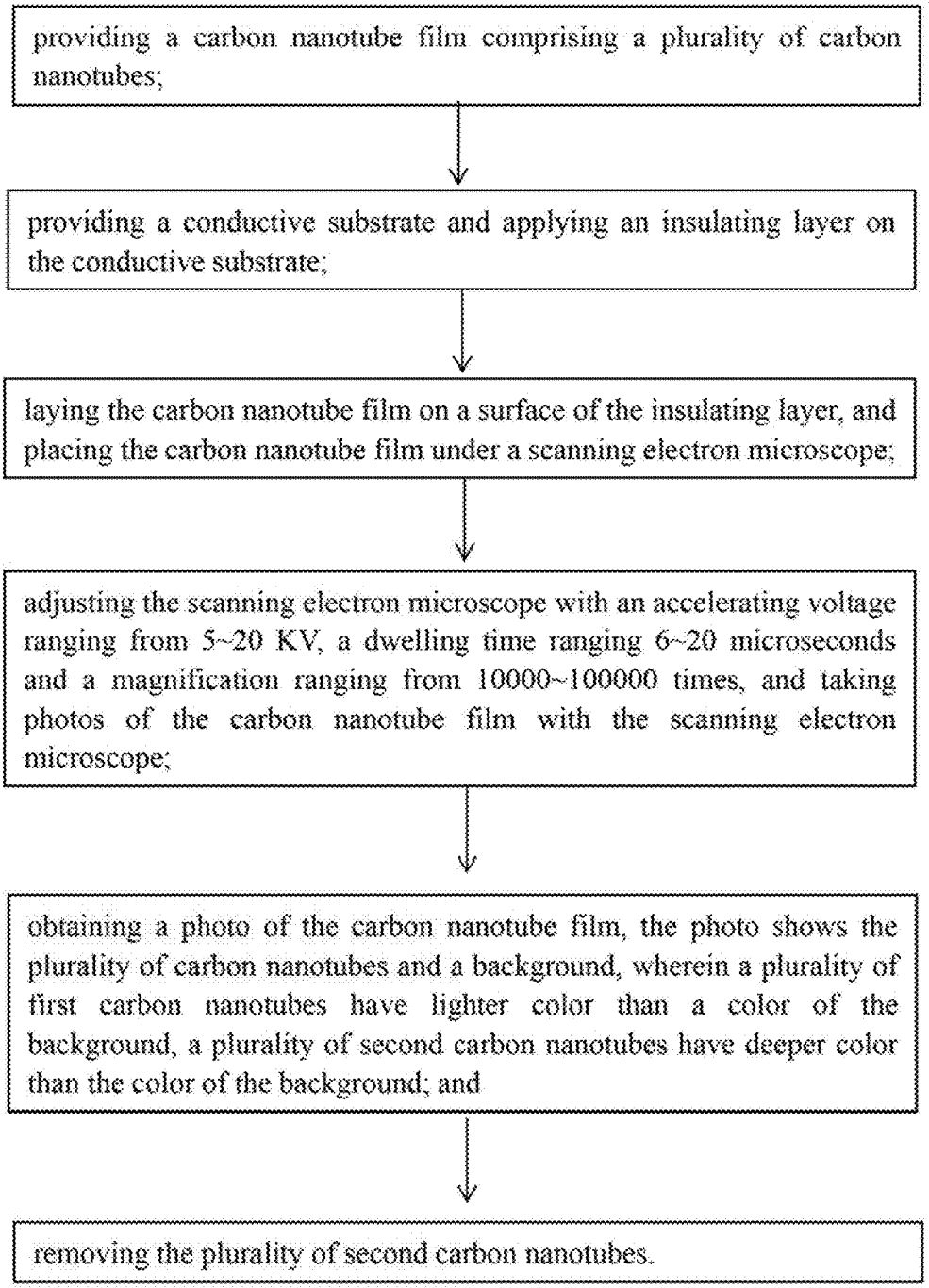
FIG. 1 is a chart flow showing a method for making transparent conductive layer according to one embodiment.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Referring to FIG. 1, one embodiment is described in relation to a method for making transparent conductive layer. The method for making transparent conductive layer includes steps of:

S1: providing a carbon nanotube film comprising a plurality of carbon nanotubes;

S2: providing a conductive substrate and applying an insulating layer on the conductive substrate;

S3: laying the carbon nanotube film on a surface of the insulating layer, and placing the carbon nanotube film under a scanning electron microscope;

S4: adjusting the scanning electron microscope with an accelerating voltage ranging from about 5 KV to about 20 KV, a dwelling time ranging about 6 microseconds to about 20 microseconds and a magnification ranging from about 10000 times to about 100000 times, and taking photos of the carbon nanotube film with the scanning electron microscope; and S5: obtaining a photo of the carbon nanotube film, the photo shows the plurality of carbon nanotubes and a background, wherein a plurality of first carbon nanotubes have lighter color than a color of the background, a plurality of second carbon nanotubes have deeper color than the color of the background; and S6: removing the plurality of second carbon nanotubes.

In step S1, the carbon nanotube film includes a plurality of carbon nanotubes. The plurality of carbon nanotubes can be single-walled carbon nanotubes, double-walled carbon nanotubes or multi-walled carbon nanotubes. The plurality of carbon nanotubes includes metallic carbon nanotubes and semiconducting carbon nanotubes. A diameter of the carbon nanotubes can be in a range from about 0.5 nanometers to about 150 nanometers. In some embodiments, the diameter of the carbon nanotubes can be in a range from about 1 nanometer to about 10 nanometers. The plurality of carbon nanotubes can be arranged randomly or orderly. In one embodiment, the plurality of carbon nanotubes can be crossed with each other. In other embodiment, the plurality of carbon nanotubes can be arranged parallel with each other. In the present embodiment, the plurality of carbon nanotubes in the carbon nanotube film are parallel with each other and parallel with the surface of the insulating layer.

In step S2, a material of the conductive substrate is not limited, as long as it is a conductive material. The material of the conductive substrate can be metal, conductive organic material, or a doped conductive material. In the present embodiment, the material of the conductive substrate is doped silicon. A material of the insulating layer can be oxide or polymer material. In the present embodiment, the material of the insulating layer silicon oxide. A thickness of the insulating layer ranges from about 50 nanometers to about 300 nanometers.

In step S4, in some embodiments, the accelerating voltage is in a range from about 15 KV to about 20 kV and the dwelling time is in a range from about 10 microseconds to about 20 microseconds. In the present embodiment, the acceleration voltage is 10 kV, the dwelling time is 20 microseconds, and the magnification is 20,000 times.

Figure 2:
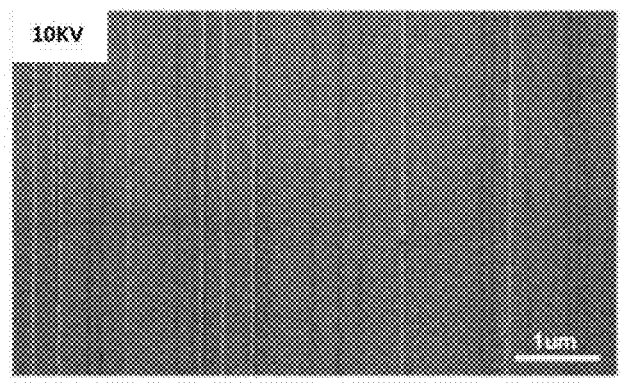
FIG. 2 is a photo of a carbon nanotube film obtained in method for making transparent conductive layer according to one embodiment.
Figure 3:
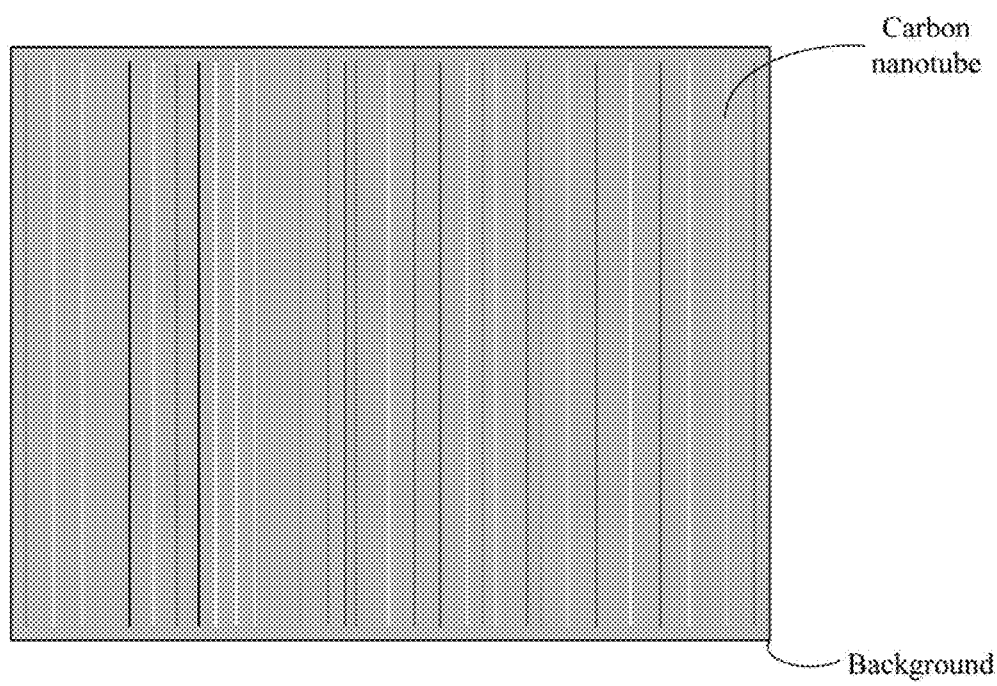
FIG. 3 is a structure schematic view of FIG. 2.

In step S5, a photo of the carbon nanotube film is obtained as shown in FIG. 2, and the schematic view thereof is shown in FIG. 3. FIGS. 2 and 3 show a background and an image of the plurality of carbon nanotubes in the carbon nanotube film. As can be seen from FIGS. 2 and 3, the color of the plurality of first carbon nanotubes is lighter than the color of the background, and the of color of the plurality second carbon nanotubes is deeper than the color of the background. The first carbon nanotubes with lighter color than the background are metallic carbon nanotubes. The second carbon nanotubes with deeper color than the background are semiconducting carbon nanotubes.

In the present disclosure, the method for making transparent conductive layer includes a step of distinguishing types of carbon nanotubes by using a scanning electron microscope. Because of the accelerating voltage and the dwelling time of the scanning electron microscope disclosed in the present disclosure, a photo of carbon nanotube film like FIG. 2 is obtained. In FIG. 2, the first carbon nanotubes with lighter color than the background are metallic carbon nanotubes, the second carbon nanotubes with deeper color than the background are semiconducting carbon nanotubes.

Figure 4:
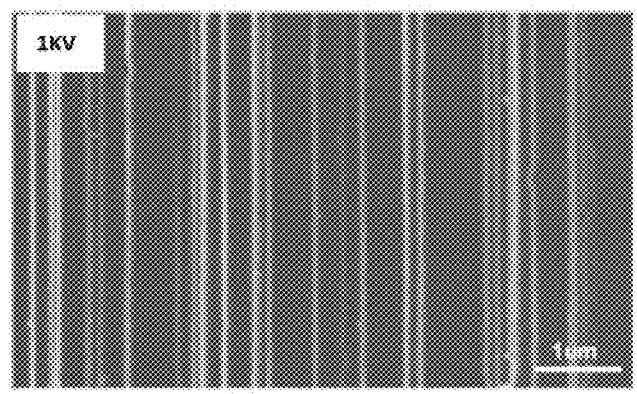
FIG. 4 is a photo of a carbon nanotube obtained by traditional scanning electron microscope distinguishing method.
Figure 5:
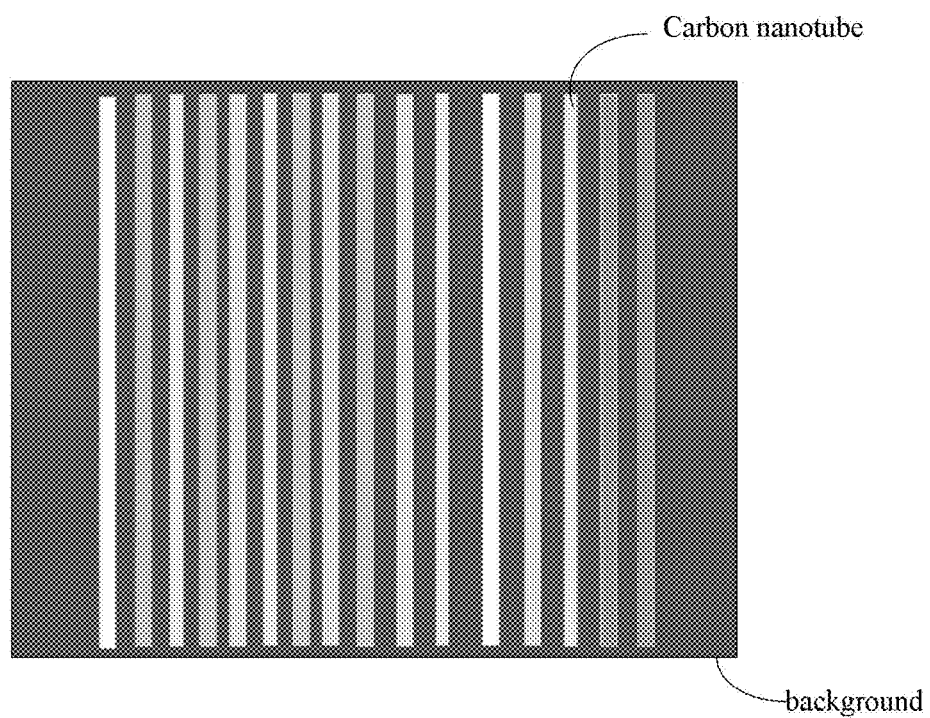
FIG. 5 is a structure schematic view of FIG. 4.

Referring to FIGS. 4 and 5, in the conventional method of distinguishing carbon nanotubes using a scanning electron microscope, a lower (1 kV or so) accelerating voltage is used in order to obtain a clear and high contrast photograph. In the carbon nanotube photo obtained by the traditional scanning electron microscope characterization method, the electrical conductivity of carbon nanotubes is also related to the color of the carbon nanotubes in the photo. The lighter the color, the better the electrical conductivity. However, the color of all the carbon nanotubes including the metallic carbon nanotubes and the semiconducting carbon nanotubes is lighter than the color of the photo background.

Compared FIG. 4 obtained by the traditional method for characterizing carbon nanotubes by scanning electron microscopy with FIG. 2 obtained by the method for characterizing carbon nanotubes of the present disclosure, the method for characterizing carbon nanotubes of the present disclosure has the many advantages. The advantages are listed below. In the carbon nanotube photo obtained by the traditional scanning electron microscope characterizing method, the color of all the carbon nanotubes including metallic carbon nanotubes and semiconducting carbon nanotubes, is lighter than the color of the photo background. When the metallic carbon nanotubes and the semiconducting carbon nanotubes are both present in the photo, it is very hard to distinguish the type of carbon nanotubes having middle color, such as gray carbon nanotubes. However, in carbon nanotube photo obtained by the method for characterizing carbon nanotubes according to present disclosure, the color of metallic carbon nanotubes is lighter than the color of the background, and the color of semiconducting carbon nanotubes is deeper than the color of the background. As such, metallic carbon nanotubes and semiconducting carbon nanotubes can be distinguished quickly and without mistake.

Further, in the carbon nanotube photo obtained by the traditional scanning electron microscope characterization method, the color of both the metallic carbon nanotubes and the semiconducting carbon nanotubes displayed in the photo is lighter than the photo background color, when there is only one type of carbon nanotubes in the photo, it is difficult to judge that the carbon nanotubes in the photo are metallic carbon nanotubes or semiconducting carbon nanotubes. However, in carbon nanotube photo obtained by the method for characterizing carbon nanotubes according to present disclosure, the color of metallic carbon nanotubes is lighter than the color of the background, and the color of semiconducting carbon nanotubes is deeper than the color of the background. As such, even if there is a single type of carbon nanotubes, the type of carbon nanotubes can be distinguished quickly and without mistake.

Further more, compared with FIG. 2, the contract of FIG. 4 is higher, the carbon nanotubes are visually more easily observed, and the photo is more beautiful. However, the photo obtained in the embodiment of the present disclosure is relatively low in contract, and the photo is also relatively not beautiful. As such, in order to get the photo like FIG. 4, lower (1 kV or less than that) accelerating voltage is used in the existing technology to characterize carbon nanotubes. As such, the present disclosure provides a method for distinguishing carbon nanotubes overcoming technical bias and capable of accurately judging the types of carbon nanotubes.

Moreover, compared with FIG. 4, a width of the carbon nanotube in FIG. 2 is relatively small, and therefore, the method for distinguishing carbon nanotube provided by the present disclosure is more suitable for distinguish carbon nanotubes having a higher density.

Step S5 includes sub-steps of:

S51: building a first coordinate system, placing the photo of the carbon nanotube film in the first coordinate system and reading coordinate values of the second carbon nanotubes in the first coordinate system;

S52: building a second coordinate system according to the same proportion on the carbon nanotube film as the photo of the carbon nanotube film, and identifying the plurality of second carbon nanotubes according to the coordinate values of the plurality of second carbon nanotubes in the first coordinate system; and S53: removing the plurality of second carbon nanotubes.

In the present embodiment, the metallic carbon nanotubes are protected by electron beam exposure, and the semiconductor-type carbon nanotubes are exposed, and the semiconductor-type carbon nanotubes are removed by plasma etching.

The method for making a transparent conductive layer according to the present invention is characterized in that the carbon nanotubes in the carbon nanotube film are characterized by the above-described method, so that the type of the carbon nanotubes can be accurately and quickly judged to remove the semiconductor type carbon nanotubes. A transparent conductive layer containing only metallic carbon nanotubes is obtained, and therefore, the transparent conductive layer is excellent in conductivity.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for making transparent conductive layer comprising:
    providing a carbon nanotube film comprising a plurality of carbon nanotubes;
    providing a conductive substrate and applying an insulating layer on the conductive substrate;
    laying the carbon nanotube film on a surface of the insulating layer, and placing the carbon nanotube film under a scanning electron microscope;
    adjusting the scanning electron microscope with an accelerating voltage ranging from about 5 KV to about 20 KV, a dwelling time ranging about 6 microseconds to about 20 microseconds and a magnification ranging from about 10000 times to about 100000 times, and taking photos of the carbon nanotube film with the scanning electron microscope;
    obtaining a photo of the carbon nanotube film, wherein the photo shows the plurality of carbon nanotubes and a background, a plurality of first carbon nanotubes of the plurality of carbon nanotubes have lighter color than a color of the background, a plurality of second carbon nanotubes of the plurality of carbon nanotubes have deeper color than the color of the background; and
    removing the plurality of second carbon nanotubes.

2. The method of claim 1, wherein a material of the conductive substrate is metal, conductive organic material, or a doped conductive material.

3. The method of claim 1, wherein a material of the conductive substrate is doped silicon, and a material of the insulating layer is silicon oxide.

4. The method of claim 1, wherein a material of the insulating layer is oxide or polymer material.

5. The method of claim 4, wherein a thickness of the insulating layer ranges from about 50 nanometers to about 300 nanometers.

6. The method of claim 1, wherein the plurality of carbon nanotubes comprises a plurality of metallic carbon nanotubes and a plurality of semiconducting carbon nanotubes.

7. The method of claim 6, wherein the plurality of carbon nanotubes are parallel with a surface of the insulating layer.

8. The method of claim 1, wherein the accelerating voltage is ranged from about 15 KV to about 20 kV.

9. The method of claim 1, wherein the dwelling time is in a range from 10 about microseconds to about 20 microseconds.

10. The method of claim 1, wherein the carbon nanotube film comprise a plurality of metallic carbon nanotubes with a color lighter than a color of the background and a plurality of semiconducting carbon nanotubes with a color deeper than the color of the background.

11. The method of claim 1, wherein the step of removing the plurality of second carbon nanotubes comprises:
    building a first coordinate system, placing the photo of the carbon nanotube film in the first coordinate system and reading coordinate values of the second carbon nanotubes in the first coordinate system;
    building a second coordinate system according to the same proportion on the carbon nanotube film as the photo of the carbon nanotube film, and identifying the plurality of second carbon nanotubes according to the coordinate values of the plurality of second carbon nanotubes in the first coordinate system; and
    removing the plurality of second carbon nanotubes.

12. The method of claim 11, wherein the metallic carbon nanotubes are protected by electron beam exposure, and the semiconductor-type carbon nanotubes are exposed.

13. The method of claim 12, wherein the semiconductor-type carbon nanotubes are removed by plasma etching.

14. A method for making transparent conductive layer comprising:
    providing a carbon nanotube film comprising a plurality of carbon nanotubes and placing the carbon nanotube film under a scanning electron microscope;
    adjusting the scanning electron microscope with an accelerating voltage ranging from about 5 KV to about 20 KV, a dwelling time ranging about 6 microseconds to about 20 microseconds and a magnification ranging from about 10000 times to about 100000 times;
    taking photo of the carbon nanotube film with the scanning electron microscope to get a photo pf the carbon nanotube film, the photo shows the plurality of carbon nanotubes and a background, wherein a plurality of first carbon nanotubes have lighter color than a color of the background, a plurality of second carbon nanotubes have deeper color than the color of the background; and
    removing the plurality of second carbon nanotubes.

* * * * *